(12) United States Patent
Zhang et al.

(10) Patent No.: US 11,316,140 B2
(45) Date of Patent: Apr. 26, 2022

(54) DISPLAY SUBSTRATE, METHOD FOR MANUFACTURING SAME, AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Aidi Zhang, Beijing (CN); Zhenqi Zhang, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 119 days.

(21) Appl. No.: 16/825,107

(22) Filed: Mar. 20, 2020

(65) Prior Publication Data
US 2021/0066673 A1 Mar. 4, 2021

(30) Foreign Application Priority Data
Aug. 30, 2019 (CN) .......................... 201910811474.7

(51) Int. Cl.
*H01L 51/56* (2006.01)
*H01L 51/50* (2006.01)

(52) U.S. Cl.
CPC ............ *H01L 51/56* (2013.01); *H01L 51/502* (2013.01); *H01L 51/5036* (2013.01); *H01L 51/5056* (2013.01); *H01L 51/5072* (2013.01); *H01L 2251/303* (2013.01)

(58) Field of Classification Search
CPC ... H01L 51/56; H01L 51/502; H01L 51/5036; H01L 51/5056; H01L 51/5072; H01L 2251/303
See application file for complete search history.

(56) References Cited

U.S. PATENT DOCUMENTS

2012/0270231 A1* 10/2012 Smith .................... C09K 11/02
435/7.2
2013/0015424 A1* 1/2013 Chung .................... H01L 51/52
257/9
2019/0207163 A1* 7/2019 Paek ................... H01L 51/5012

* cited by examiner

*Primary Examiner* — Marc Anthony Armand
(74) *Attorney, Agent, or Firm* — Brooks Kushman P.C.

(57) ABSTRACT

A display substrate, comprising a plurality of light emitting units of different colors, each of which comprises: an electron transport layer, a hole transport layer, a quantum-dot light emitting layer located between the electron transport layer and the hole transport layer; and a hydrophilicity and hydrophobicity variable layer, located between the electron transport layer and the quantum-dot light emitting layer and configured to undergo an exposure treatment to change hydrophilicity and hydrophobicity of sides of the hydrophilicity and hydrophobicity variable layer that are in contact with the electron transport layer and the quantum-dot light emitting layer.

19 Claims, 5 Drawing Sheets

DISPLAY SUBSTRATE, METHOD FOR MANUFACTURING SAME, AND DISPLAY DEVICE

CROSS-REFERENCE TO RELATED APPLICATION

This application claims priority to Chinese Patent Application No. 201910811474.7 filed on Aug. 30, 2019, which is incorporated herein by reference in its entirety.

TECHNICAL FIELD

The present disclosure relates to the field of display technology, and in particular to a display substrate, a method for manufacturing the same, and a display device.

BACKGROUND

In recent years, quantum dots have become used in fields of display, biosensors, lighting, solar cells and other applications because they are suitable for solution processing and preparation, and have excellent physicochemical and optical properties, such as a wide excitation spectrum range, a narrow fluorescence emission spectrum, good photostability, long fluorescence lifetime, and high quantum yield of fluorescence. Among them, quantum-dots light emitting diode (referred to as QLED) display devices have become a focus of attention in the display field.

In related art, the OLED display devices have low luminous efficiency, which reduces display efficiency of the display devices.

SUMMARY

In a first aspect, embodiments of the present disclosure provide a display substrate, including a plurality of light emitting units of different colors, each of which includes: an electron transport layer, a hole transport layer, a quantum-dot light emitting layer located between the electron transport layer and the hole transport layer; and a hydrophilicity and hydrophobicity variable layer located between the electron transport layer and the quantum-dot light emitting layer, and configured to undergo an exposure treatment to change hydrophilicity and hydrophobicity of sides of the hydrophilicity and hydrophobicity variable layer that are in contact with the electron transport layer and the quantum-dot light emitting layer.

According to some optional embodiments of the present disclosure, the side of the hydrophilicity and hydrophobicity variable layer that is in contact with the electron transport layer is changed from being hydrophilic to being hydrophobic after the exposure treatment.

According to some optional embodiments of the present disclosure, the side of the hydrophilicity and hydrophobicity variable layer that is in contact with the quantum-dot light emitting layer is changed from being hydrophilic to being hydrophobic after the exposure treatment.

According to some optional embodiments of the present disclosure, the exposure treatment of the hydrophilicity and hydrophobicity variable layer is performed by irradiation with ultraviolet rays; prior to the exposure treatment by the irradiation with the ultraviolet rays, an exterior of the hydrophilicity and hydrophobicity variable layer is hydrophilic, and an interior of the hydrophilicity and hydrophobicity variable layer is hydrophobic; and subsequent to the exposure treatment by the irradiation with the ultraviolet rays, the exterior of the hydrophilicity and hydrophobicity variable layer becomes hydrophobic, and the interior of the hydrophilicity and hydrophobicity variable layer becomes hydrophilic.

According to some optional embodiments of the present disclosure, the hydrophilicity and hydrophobicity variable layer includes water-soluble polypeptide polymers.

According to some optional embodiments of the present disclosure, the hydrophilicity and hydrophobicity variable layer includes water-soluble proteins.

According to some optional embodiments of the present disclosure, amino acids of the lower proteins which are in contact with the electron transport layer include amine functional groups which form hydrogen bonding adsorption effects with hydroxyl groups on a surface of the electron transport layer.

According to some optional embodiments of the present disclosure, amino acids of the upper proteins which are in contact with the quantum-dot light emitting layer include amine functional groups, which coordinate with metal atoms on a nanocrystal surface of the quantum-dot light emitting layer to form adsorption effects.

According to some optional embodiments of the present disclosure, the metal atom on the nanocrystal surface of the quantum-dot light emitting layer includes one or more of Cd, Pb, Se and Zn.

According to some optional embodiments of the present disclosure, the light emitting units include a red light emitting unit, a green light emitting layer, and a blue light emitting unit.

According to some optional embodiments of the present disclosure, the electron transport layer includes a zinc oxide material.

According to some optional embodiments of the present disclosure, the electron transport layer includes a mixed material of zinc oxide and a metal.

According to some optional embodiments of the present disclosure, an interval between the quantum-dot light emitting layer included in each of the plurality of light emitting units of different colors and the quantum-dot light emitting layer included in an adjacent one of the light-emitting units is consistent.

In a second aspect, embodiments of the present disclosure further provide a display device that includes a display substrate. The display substrate includes a plurality of light emitting units of different colors, each of which includes: an electron transport layer, a hole transport layer, a quantum-dot light emitting layer located between the electron transport layer and the hole transport layer; and a hydrophilicity and hydrophobicity variable layer, located between the electron transport layer and the quantum-dot light emitting layer, and configured to undergo an exposure treatment to change hydrophilicity and hydrophobicity of sides of the hydrophilicity and hydrophobicity variable layer that are in contact with the electron transport layer and the quantum-dot light emitting layer.

In a third aspect, embodiments of the present disclosure further provide a method for manufacturing a display substrate, which includes: forming an electron transport layer; forming hydrophilicity and hydrophobicity variable layers and a plurality of quantum-dot light emitting layers of different colors on the electron transport layer, wherein each of the hydrophilicity and hydrophobicity variable layer is located between each of the quantum-dot light emitting layers and the electron transport layer; forming a hole transport layer on the plurality of quantum-dot light emitting layers of different colors; and performing an exposure treatment on each of the hydrophilicity and hydrophobicity variable layer to change hydrophilicity and hydrophobicity of sides of the hydrophilicity and hydrophobicity variable layer that are in contact with the electron transport layer and the quantum-dot light emitting layer.

According to some optional embodiments of the present disclosure, the forming the hydrophilicity and hydrophobicity variable layers and the plurality of quantum-dot light emitting layers of different colors on the electron transport layer includes forming the quantum-dot light emitting layer of each color and its corresponding hydrophilicity and hydrophobicity variable layer on the electron transport layer, wherein the quantum-dot light emitting layers of the different colors are formed separately.

According to some optional embodiments of the present disclosure, the forming the quantum-dot light emitting layer of each color and its corresponding hydrophilicity and hydrophobicity variable layer on the electron transport layer, forming the quantum-dot light emitting layer of one color and its corresponding hydrophilicity and hydrophobicity variable layer includes forming the hydrophilicity and hydrophobicity variable layer and the quantum-dot light emitting layer of the color covering the hydrophilicity and hydrophobicity variable layer on the electron transport layer; exposing a portion of the hydrophilicity and hydrophobicity variable layer located in a target region with a mask to change hydrophilicity and hydrophobicity of sides of the exposed portion of the hydrophilicity and hydrophobicity variable layer in the target region, which are in contact with the electron transport layer and the quantum-dot light emitting layer; and dissolving a portion of the hydrophilicity and hydrophobicity variable layer, which is not exposed, by using a developing solution to form the hydrophilicity and hydrophobicity variable layer in the target region and the quantum-dot light emitting layer of the color.

According to some optional embodiments of the present disclosure, the exposing the portion of the hydrophilicity and hydrophobicity variable layer in the target region with the mask includes covering the quantum-dot light emitting layer with the mask which includes a light transmitting region corresponding to the target region; and exposing the portion of the hydrophilicity and hydrophobicity variable layer in the target region through ultraviolet light passing through the quantum-dot light emitting layer.

According to some optional embodiments of the present disclosure, the developing solution includes deionized or distilled water.

According to some optional embodiments of the present disclosure, the hydrophilicity and hydrophobicity variable layer includes water-soluble polypeptide polymers or water-soluble proteins.

BRIEF DESCRIPTION OF THE DRAWINGS

In order to illustrate the technical solutions of the embodiments of the present disclosure more apparently, the accompanying drawings required in the description of the embodiments of the present disclosure will be briefly introduced below. It is evident that the drawings used in the following description relate to only some embodiments of the present disclosure, and based on these drawings, the other drawings can be obtained by those of ordinary skill in the art without exercising any creative work.

DETAILED DESCRIPTION

The technical solutions of the embodiments of the present disclosure will be clearly and completely described hereinafter with reference to the accompanying drawings in the detailed description of the present disclosure. Obviously, the described embodiments are a part, rather than all, of the embodiments of the present disclosure. Based on the described embodiments of the present disclosure, all the other embodiments obtained by those of ordinary skill in the art fall within the protection scope of the present disclosure.

In the related art, the quantum-dot light emitting layer may deteriorate during the manufacturing process of the QLED display device, which results in a low luminous efficiency of the quantum-dot light emitting layer and thus a reduction in the display efficiency of the display device.

In view of this, embodiments of the present disclosure provide a display substrate, a method for manufacturing the display substrate and a display device, which are capable of solving the problem that the OLED display device in the related art has the low luminous efficiency, which reduces the display efficiency of the display device.

Figure 1:
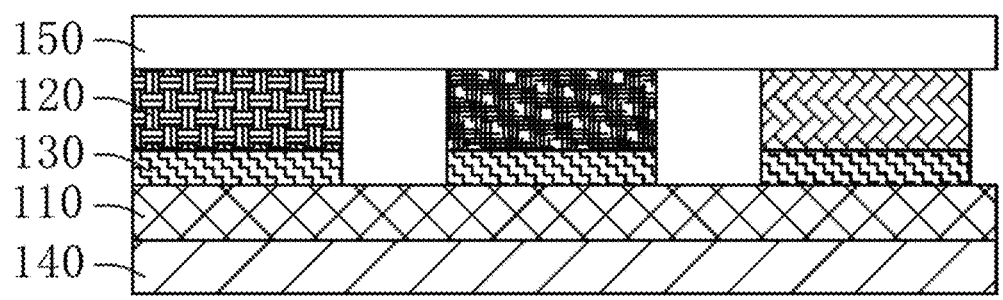
FIG. 1 is a structural diagram of a display substrate provided in an embodiment of the present disclosure.

Embodiments of the present disclosure provide a display substrate as shown in FIG. 1, which includes a plurality of light emitting units of different colors. each of the plurality of light emitting units includes an electron transport layer 110, a hole transport layer 150, and a quantum-dot light emitting layer 120 that is located between the electron transport layer 110 and the hole transport layer 150. Moreover, the display substrate further includes a hydrophilicity and hydrophobicity variable layer 130 which is located between the electron transport layer 110 and the quantum-dot light emitting layer 120. Here, an exterior and an interior of the hydrophilicity and hydrophobicity variable layer 130 can be changed in terms of their hydrophilicity and hydrophobicity by an exposure treatment, for example. In particular, by the exposure treatment, the hydrophilicity and hydrophobicity of sides of the hydrophilicity and hydrophobicity variable layer 130 that are in contact with the electron transport layer 110 and the quantum-dot light emitting layer 120 are changed.

Specifically, after the exposure treatment, the side of the hydrophilicity and hydrophobicity variable layer 130 that is in contact with the electron transport layer 110 is changed from being hydrophilic to being hydrophobic; and the side of the hydrophilicity and hydrophobicity variable layer 130 that is in contact with the quantum-dot light emitting layer 120 is changed from being hydrophilic to being hydrophobic.

In this embodiment of the present disclosure, the exposure treatment is performed by irradiation with ultraviolet rays.

Accordingly, prior to the exposure treatment by the irradiation with the ultraviolet rays, the exterior of the hydrophilicity and hydrophobicity variable layer 130 is hydrophilic, and the interior of the hydrophilicity and hydrophobicity variable layer is hydrophobic; and subsequent to the exposure treatment by the irradiation with the ultraviolet rays, the exterior of the hydrophilicity and hydrophobicity variable layer 130 becomes hydrophobic, and the interior of the hydrophilicity and hydrophobicity variable layer becomes hydrophilic.

In the embodiment of the present disclosure, the hydrophilicity and hydrophobicity variable layer 130 includes water-soluble polypeptide polymers or water-soluble proteins.

Here, when the hydrophilicity and hydrophobicity variable layer 130 includes the water-soluble proteins, amine functional groups of amino acids of the lower proteins form adsorption effects with hydroxyl groups on a surface (a hydroxyl-rich zinc oxide surface) of the electron transport layer 110, and the adsorption effects are hydrogen bonding adsorption effects, and no chemical bond is formed. On the other hand, amine functional groups of the amino acids of the upper protein interact with quantum dots in the quantum-dot light emitting layer 120 and are adsorbed onto its surface. That is, metal atoms, such as Cd, Pb, Se and Zn, on a nanocrystal surface of the quantum-dot light emitting layer 120 coordinate with the amine groups and no chemical bond is formed.

In the embodiments of the present disclosure, under irradiation of ultraviolet rays, the hydrogen bond of the water-soluble polypeptide polymer or water-soluble protein included in the hydrophilicity and hydrophobicity variable layer is destroyed, that is, the amino acid on a spatial structure of a peptide chain in the hydrophilic-hydrophobic denaturation layer changes in position.

In the embodiments of the present disclosure, before performing the exposure treatment by irradiation with the ultraviolet rays, the exterior of the hydrophilicity and hydrophobicity variable layer includes one or more of lysine, histidine, and arginine, and the interior of the hydrophilicity and hydrophobicity variable layer includes one or more of alanine, cysteine, isoleucine, leucine, methionine, phenylalanine, glutamine, asparagine, and valine. Moreover, after performing the exposure treatment by irradiation with the ultraviolet rays, the exterior of the hydrophilicity and hydrophobicity variable layer includes one or more of alanine, cysteine, isoleucine, leucine, methionine, phenylalanine, glutamate, asparagine, and valine, and the interior of the hydrophilicity and hydrophobicity variable layer includes one or more of lysine, histidine, and arginine.

Hereinafter, the working principle of the hydrophilicity and hydrophobicity variable layer 130 will be described in detail through the following embodiments.

First, amino acids constitute a polypeptide, and polypeptides constitute a protein. Specifically, a polypeptide refers to a linear amino acid chain formed by dehydration condensation of multiple amino acids. On the other hand, a protein may consist of a single polypeptide chain, or multiple polypeptide chains.

There are more than 20 common amino acids, among which hydrophilic amino acids include lysine, histidine, and arginine, and hydrophobic amino acids include alanine, cysteine, isoleucine, leucine, methionine, phenylalanine, glutamine, asparagine, valine, etc.

Proteins (or polypeptides) have certain spatial structures. If water-soluble amino acids (lysine, histidine, arginine) are distributed on an outer surface, the protein has good water solubility. If hydrophobic amino acids are distributed on the outer surface, it has poor water solubility.

Under the irradiation of ultraviolet (UV) light, proteins (or polypeptides) are denatured. This process is mainly to destroy hydrogen bonds in protein molecules (since there is no cleavage and formation of any chemical bond in the change process, no new substance is formed). The destroying of the hydrogen bonds represents a change in the secondary structure of the protein, that is, the positions of the amino acids on the spatial structure of the peptide chain are changed.

A patterning process for the display substrate provided by the embodiments of the present disclosure may be referred to as "protein film formation—UV exposure—protein denaturation".

In the embodiment of the present disclosure, a protein (or a polypeptide) with better water solubility is selected. After the treatment by the process, an inverted quantum-dots light emitting diode (QLED) device structure is finally formed, in which there is a layer of the proteins (or polypeptide chains) between the electron transport layer (a film of zinc oxide) and the light emitting layer (a film of quantum dots), and the amino acids are arranged in a certain law and have the following characteristics.

Before the exposure with the ultraviolet rays, amino acids on the outer side of the proteins (or polypeptide chains) are all hydrophilic amino acids (lysine, histidine, and arginine); and hydrophobic amino acids (alanine, cysteine, isoleucine, leucine, methionine, phenylalanine, glutamine, asparagine, valine, etc.) are distributed in the interior of the structure of the proteins (or polypeptide chains).

After the exposure with the ultraviolet rays, the proteins (or polypeptide chains) are denatured, and the spatial positions of the amino acids (structure) are changed. The amino acids on the outer sides of the layer of the proteins (or polypeptide chains) are hydrophobic amino acids (alanine, cysteine, isoleucine, leucine, methionine, phenylalanine, glutamine, asparagine, valine, etc.), and the hydrophilic amino acids (lysine, histidine, arginine) go inside. The proteins (or polypeptide chains) have reduced solubility, and thus precipitate and exist between the light emitting layer and the electron transport layer.

Accordingly, the precipitation of the proteins (or polypeptides) can increase an interaction force between the electron transport layer and the light emitting layer. Specifically, in the structure of the inverted QLED device, since the amino acids themselves have amine groups, the amine functional groups of the amino acids in a lower layer of the proteins form adsorption effects with the hydroxyl groups on the surface of the electron transport layer. On the other hand, the amine functional groups of the amino acids in an upper layer of the proteins interact with the quantum dots of the light emitting layer and are adsorbed onto its surface to enhance the fixing effect with the quantum dots. Finally, the proteins (or polypeptides) can serve as a "bridge" that connects the electron transport layer and the light emitting layer.

In the embodiment of the present disclosure, the hydrophilicity and hydrophobicity variable layer 130 located between the electron transport layer 110 and the quantum-dot light emitting layer 120 can protect the quantum-dot light emitting layer 120 connected thereto from being removed during development, so that the polypeptide polymers or proteins can replace photoresist in the conventional manufacturing process of the quantum-dot light emitting layer, thereby avoiding the damage of the quantum-dot light emitting layer 120 by an alkaline solution when the photoresist is removed by the alkaline solution in the conventional technology, and the luminous efficiency of the quantum-dot light emitting layer 120 can be improved, thereby improving the display efficiency of the display device. Therefore, the technical solutions provided by the embodiments of the present disclosure can improve the display efficiency of the display device.

The plurality of light emitting units of different colors is arranged on a base substrate 140 in a predetermined order. The plurality of light emitting units of different colors may include one or more red light emitting units, one or more green light emitting units, and one or more blue light emitting units. Of course, the plurality of light emitting units of different colors may further include light emitting units of other colors, for example, one or more white light emitting units, one or more yellow light emitting units, and the like, which are not limited herein.

Each light emitting unit includes an electron transport layer 110, a hole transport layer 150, and a quantum-dot light emitting layer 120 located between the electron transport layer 110 and the hole transport layer 150. The electron transport layer 110 can regulate a rate and an amount of injection of electrons into the quantum-dot light emitting layer, and the hole transport layer 150 can regulate a rate and an amount of injection of holes into the quantum-dot light emitting layer.

The hole transport layer 150 can be formed by spin-coating an organic substance and heating it to form a film. The organic substance can be Merck HT, or TFB (poly(9, 9-dioctyl-fluorene-co-N-(4-butylphenyl)diphenylamine)), or DuPont HT. Merck HT forms a film at 200 to 230 degrees Celsius in inert gas, TFB forms a film at 130 to 150 degrees Celsius in inert gas, and DuPont HT forms a film at 230 to 250 degrees Celsius in inert gas. A film thickness of the hole transport layer 150 can be adjusted according to a speed of rotation of a spin-coater.

It should be noted that all the spin-coating processes mentioned in the present disclosure can be performed by the spin-coater for film formation, and the thickness of the film layer can be controlled by controlling the speed of rotation of the spin-coater and a concentration of the added solution.

The light emitting unit can further include an electron injection layer and a hole injection layer. The electron injection layer is located on a side of the electron transport layer 110 facing away from the quantum-dot light emitting layer 120, and is used to increase the rate of injection of the electrons into the quantum-dot light emitting layer 120, and the hole injection layer is located at a side of the hole transport layer facing away from the quantum-dot light emitting layer 120, and is used to increase the rate of injection of the holes into the quantum-dot light emitting layer 120. The electron injection layer and the hole injection layer can reduce energy loss of the electrons and holes during the transport, thereby improving the luminous efficiency of the display device.

The hole injection layer can be formed by spin-coating an organic substance and heating it to form a film. The organic substance can be Merck HI, Nissan 2520, PEDOT 4083, PEDOT 1.3N, or DuPont HI. The Merck HI forms a film at 200 to 230 degrees Celsius in air, and PEDOT forms a film at 130 to 150 degrees Celsius in air. A film thickness of the hole injection layer can be adjusted according to the speed of rotation of the spin-coater.

In addition, a cathode of the light emitting unit is located on a side of the hole injection layer facing away from the quantum-dot light emitting layer 120. The cathode can be formed by evaporation or sputtering, and may be, for example, an aluminum film, a gold film or a silver film, or may be made of a transparent conductive material, such as indium zinc oxide (IZO).

The hydrophilicity and hydrophobicity variable layer is a structure in which physicochemical properties (hydrophilicity and hydrophobicity) of the polypeptide polymer material will be changed after exposure to the ultraviolet light. Under the irradiation of the UV light, functional groups (amino, and carboxyl) and peptide bonds which are originally located inside will be exposed, and form adsorption forces with the electron transport layer, so that the hydrophilicity and hydrophobicity variable layer will not be removed during development. The polypeptide polymer material can be a water-soluble polypeptide polymer or a water-soluble protein.

Further, the electron transport layer 110 is made of a zinc oxide material or a mixed material of zinc oxide and a metal, and the metal doped in the zinc oxide material may be magnesium, aluminum, gallium, or the like.

The functional groups of the polypeptide polymers can form adsorption forces with the functional groups (such as a hydroxyl group, a carbonyl group, etc.) on the surface of the zinc oxide material (or a material doped with zinc oxide), so as to prevent the hydrophilicity and hydrophobicity variable layer from being washed away during development.

Figure 2:
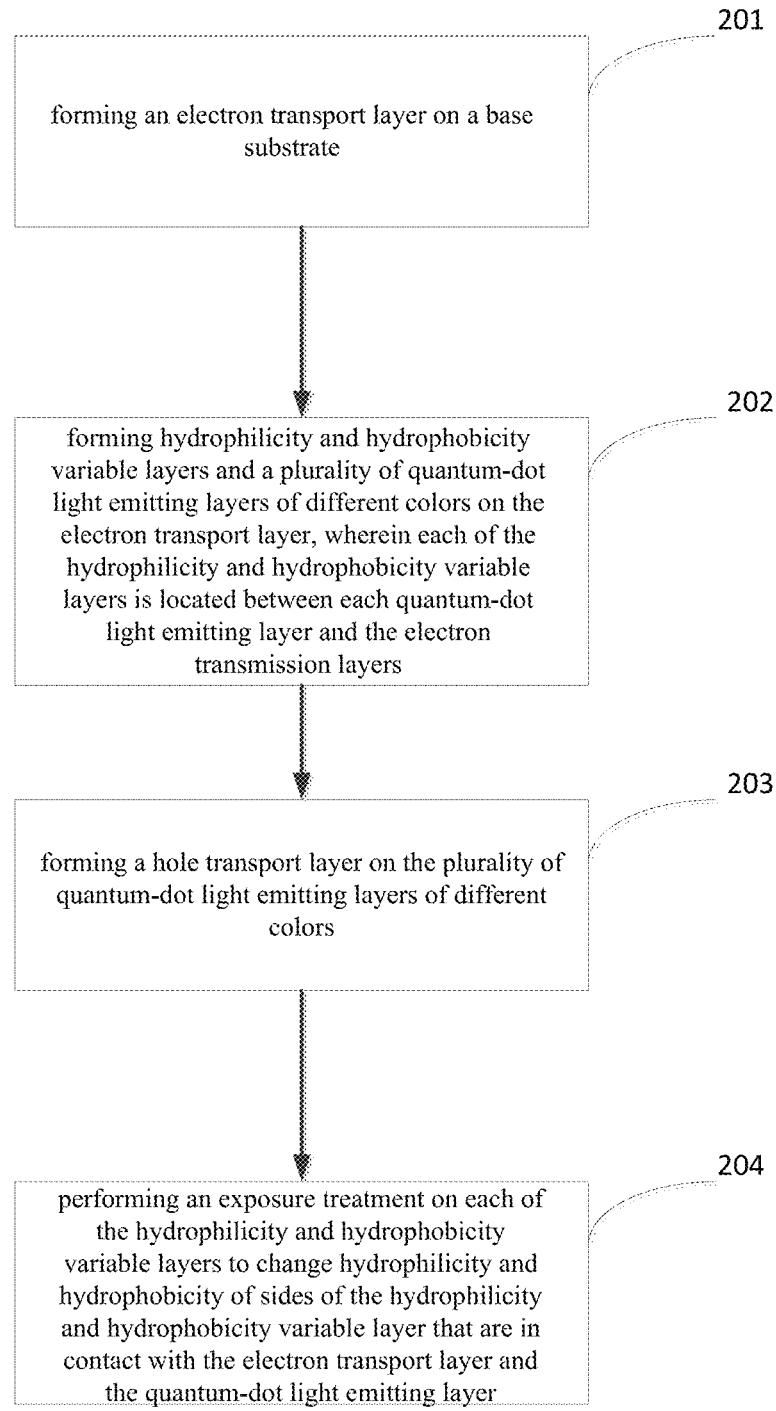
FIG. 2 is a flowchart of a method for manufacturing a display substrate provided in an embodiment of the present disclosure.

Furthermore, an embodiment of the present disclosure further provides a method for manufacturing a display substrate, as shown in FIGS. 1 and 2, which includes:

step 201: forming an electron transport layer 110 on a base substrate 140;

step 202: forming hydrophilicity and hydrophobicity variable layers 130 and a plurality of quantum-dot light emitting layers 120 of different colors on the electron transport layer 110, wherein each of the hydrophilicity and hydrophobicity variable layers 130 is located between each quantum-dot light emitting layer 120 and the electron transmission layers 110;

step 203: forming a hole transport layer 150 on the plurality of quantum-dot light emitting layers 120 of different colors; and step 204: performing an exposure treatment on each of the hydrophilicity and hydrophobicity variable layers 130 to change hydrophilicity and hydrophobicity of sides of the hydrophilicity and hydrophobicity variable layer 130 that are in contact with the electron transport layer 110 and the quantum-dot light emitting layer 120.

In the embodiment of the present disclosure, the polypeptide polymers located between the electron transport layer and the quantum-dot light emitting layer can protect the quantum-dot light emitting layer connected thereto from being removed during the development process, so that the polypeptide polymers can replace the photoresist in the conventional manufacturing process of the quantum-dot light emitting layer, thereby avoiding the damage of the quantum-dot light emitting layer by an alkaline solution when the photoresist is removed by the alkaline solution in the conventional technology, and the luminous efficiency of the quantum-dot light emitting layer can be improved, thereby improving the display efficiency of the display device. At the same time, it can also reduce the generation of the alkaline waste solution and reduce environmental pollution. Therefore, the technical solutions provided by the embodiments of the present disclosure can improve the display efficiency of the display device.

As shown in FIG. 1, each quantum-dot light emitting layer 120 together with the electron transport layer 110 and the hole transport layer 150 constitutes a light emitting unit, and thus a plurality of light emitting units of different colors are obtained. The plurality of light emitting units of different colors is arranged on the base substrate in a predetermined order, and can include one or more red light emitting units, one or more green light emitting units, and one or more blue light emitting units. Of course, the plurality of light emitting units of different colors can further include light emitting units of other colors, for example, one or more white light emitting units, one or more yellow light emitting units, and the like, which are not limited herein.

The electron transport layer 110 may be formed on the base substrate 140 by a film forming method by spin-coating and heating. Specifically, 2 grams of zinc acetate can be added dropwise to a solvent containing at least 10 mL of ethanolamine and n-butanol, and the mixed solvent is spin-coated (at a speed of rotation of 1000 to 4000 rpm) on the base substrate 140 and heated on a heat stage at 180 to 250 degrees Celsius, so as to form the electron transport layer 110.

The hole transport layer 150 can be formed by spin-coating an organic substance and heating it to form a film. The organic substance can be Merck HT, TFB, or DuPont HT. Merck HT forms a film at 200 to 230 degrees Celsius in inert gas, TFB forms a film at 130 to 150 degrees Celsius in inert gas, and DuPont HT forms a film at 230 to 250 degrees Celsius in inert gas. A film thickness of the hole transport layer 150 can be adjusted according to the speed of rotation of the spin-coater.

In addition, a hole injection layer and a cathode may be sequentially formed on a side of the hole transport layer 150 facing away from the base substrate 140. The hole injection layer can be formed by spin-coating an organic substance and heating it to form a film. The organic substance can be Merck HI, Nissan 2520, PEDOT 4083, PEDOT 1.3N, or DuPont HI. The Merck HI forms a film at 200 to 230 degrees Celsius in air, and PEDOT forms a film at 130 to 150 degrees Celsius in air. A film thickness of the hole injection layer can be adjusted according to the speed of rotation of the spin-coater. The cathode can be formed by evaporation or sputtering, and may be an aluminum film, or may be made of a transparent conductive material, such as indium zinc oxide (IZO).

Further, the step of forming the hydrophilicity and hydrophobicity variable layers 130 and the plurality of quantum-dot light emitting layers 120 of different colors on the electron transport layer 110 includes forming the quantum-dot light emitting layer 120 of each color and its corresponding hydrophilicity and hydrophobicity variable layer 130 on the electron transport layer 110, wherein the quantum-dot light emitting layers 120 of the different colors are formed separately.

In this embodiment, the quantum-dot light emitting layers 120 of the same color are formed simultaneously, and the quantum-dot light emitting layers of different colors are formed sequentially. In addition, the hydrophilicity and hydrophobicity variable layer 130 is formed at the same time as the quantum-dot light emitting layer 120 connected to it. Of course, as those skilled in the art will understand, the quantum-dot light emitting layers 120 of the same color may be formed one after the other, and the quantum-dot light emitting layers of different colors may be formed at the same time, and the embodiments of the present disclosure are not limited thereto. In addition, the hydrophilicity and hydrophobicity variable layer 130 may be formed after or before the quantum-dot light emitting layer 120 connected to it is formed.

In the above step, forming the quantum-dot light emitting layer 120 of one color and its corresponding hydrophilicity and hydrophobicity variable layer includes forming a polypeptide polymer material layer and the quantum-dot material layer of the color covering the polypeptide polymer material layer on the electron transport layer 110; exposing a portion of the polypeptide polymer material layer located in a target region with a mask such that sides of the exposed portion of the hydrophilicity and hydrophobicity variable layer 130 in the target region, which are in contact with the electron transport layer 110 and the quantum-dot light emitting layer 120, change in hydrophilicity and hydrophobicity; and dissolving a portion of the polypeptide polymer material layer, which is not exposed, by using a developing solution to form the hydrophilicity and hydrophobicity variable layer 130 in the target region and the quantum-dot light emitting layer 120 of the color.

Further, as shown in FIG. 1, an interval between the quantum-dot light emitting layer 120 included in each of the plurality of light emitting units of different colors and the quantum-dot light emitting layer 120 included in an adjacent one of the light-emitting units is consistent. However, it can be understood by those skilled in the art that the intervals may be different as actually needed.

Figure 3:
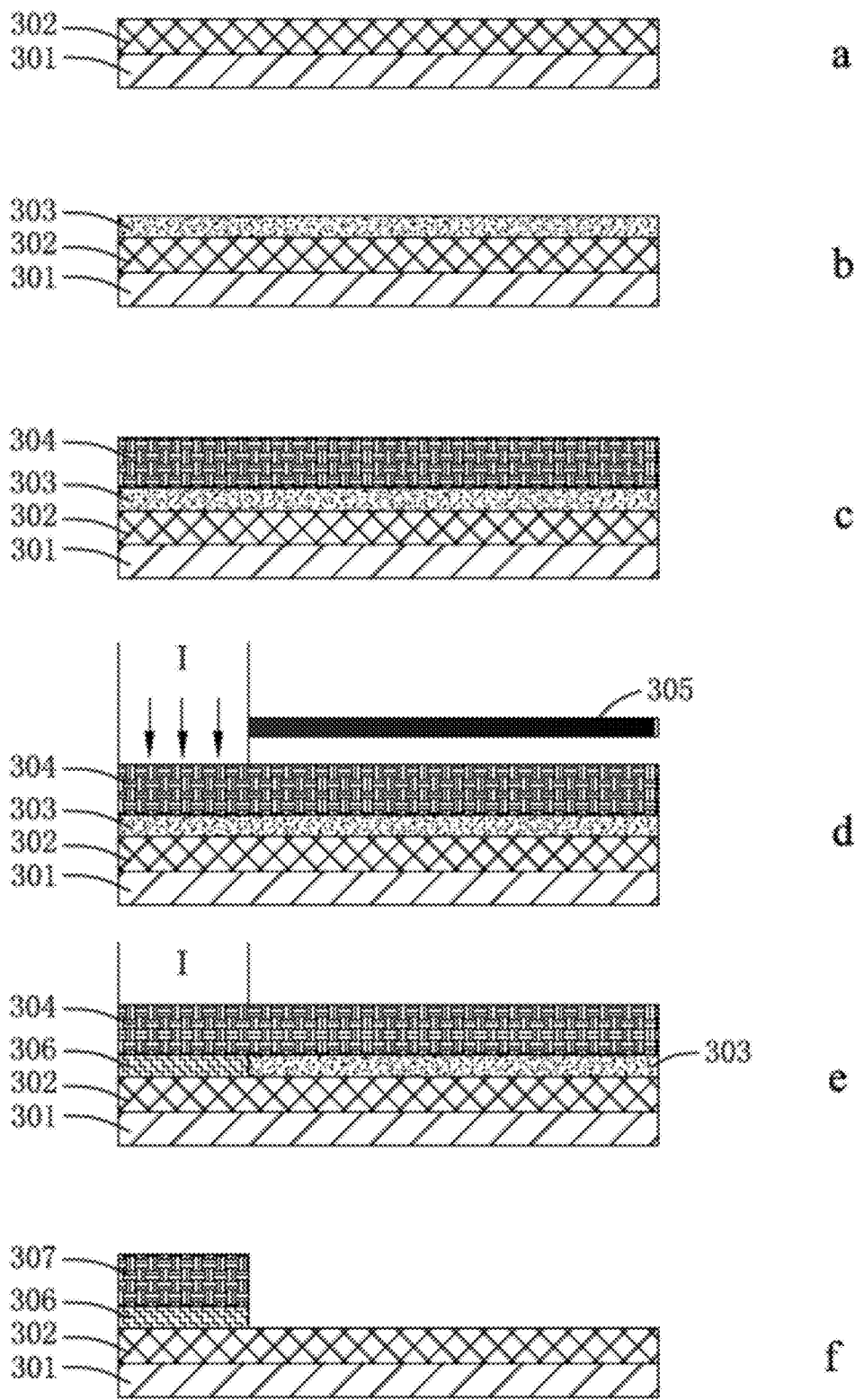
FIG. 3 is a diagram showing changes of film layers during a manufacturing process of a red quantum-dot light emitting layer of a display substrate provided in an embodiment of the present disclosure.

For example, in the embodiment as shown in FIG. 3, the quantum-dot light emitting layers of different colors include a red quantum-dot light emitting layer, a green quantum-dot light emitting layer, and a blue quantum-dot light emitting layer, and this embodiment will be described in an order of forming the red quantum-dot light emitting layer, then forming the green quantum-dot light emitting layer and finally forming the blue quantum-dot light emitting layer.

After an electron transport layer 302 has been formed on a base substrate 301 (as indicated by a in FIG. 3), which may be conductive glass such as indium tin oxide (ITO) glass or fluorine-doped $SnO_2$ transparent conductive (FTO) glass, a polypeptide polymer material layer 303 is formed on the electron transport layer 302 (as indicated by b in FIG. 3). The polypeptide polymer material layer 303 can be formed by adding dropwise 100 to 150 μL of an aqueous solution of a water-soluble peptide polymer to the electron transport layer 302, and spin-coating it by a spin-coater at a speed of rotation of 500 to 4,000 rpm, and then heating it on a heat stage at 50 to 80 degrees Celsius.

Then, a red quantum-dot material layer 304 covering the polypeptide polymer material layer 303 is formed (as indicated by c in FIG. 3). The red quantum-dot material layer 304 can be formed by spin-coating a low boiling point solution of red quantum dots in, for example, chloroform, toluene, n-hexane, n-octane, or n-heptane, onto the polypeptide polymer material layer 303, and drying it to form a film at a temperature of 80 to 120 degrees Celsius.

A portion of the polypeptide polymer material layer 303 that is located in a first region I is exposed by using a mask 305 (as indicated by d in FIG. 3) such that physicochemical properties of the exposed portion of the polypeptide polymer material layer 303 in the first region I are changed (as indicated by e in FIG. 3).

Thereafter, an unexposed portion (i.e., a portion where the physicochemical properties have not been changed) of the polypeptide polymer material layer 303 is dissolved by using a developing solution to obtain a structure as indicated by f in FIG. 3. The portion of the hydrophilicity and hydrophobicity variable layer 303, in which the physicochemical properties have been changed, forms an adsorption force with the electron transport layer 302, and thus will not be washed away by the developing solution, so as to obtain the hydrophilicity and hydrophobicity variable layer 306. Also, a portion of the red quantum-dot material layer 304 that is formed on the hydrophilicity and hydrophobicity variable layer 306 can be guaranteed not to be washed away, and thus a red quantum-dot light emitting layer 307 is obtained.

Figure 4:
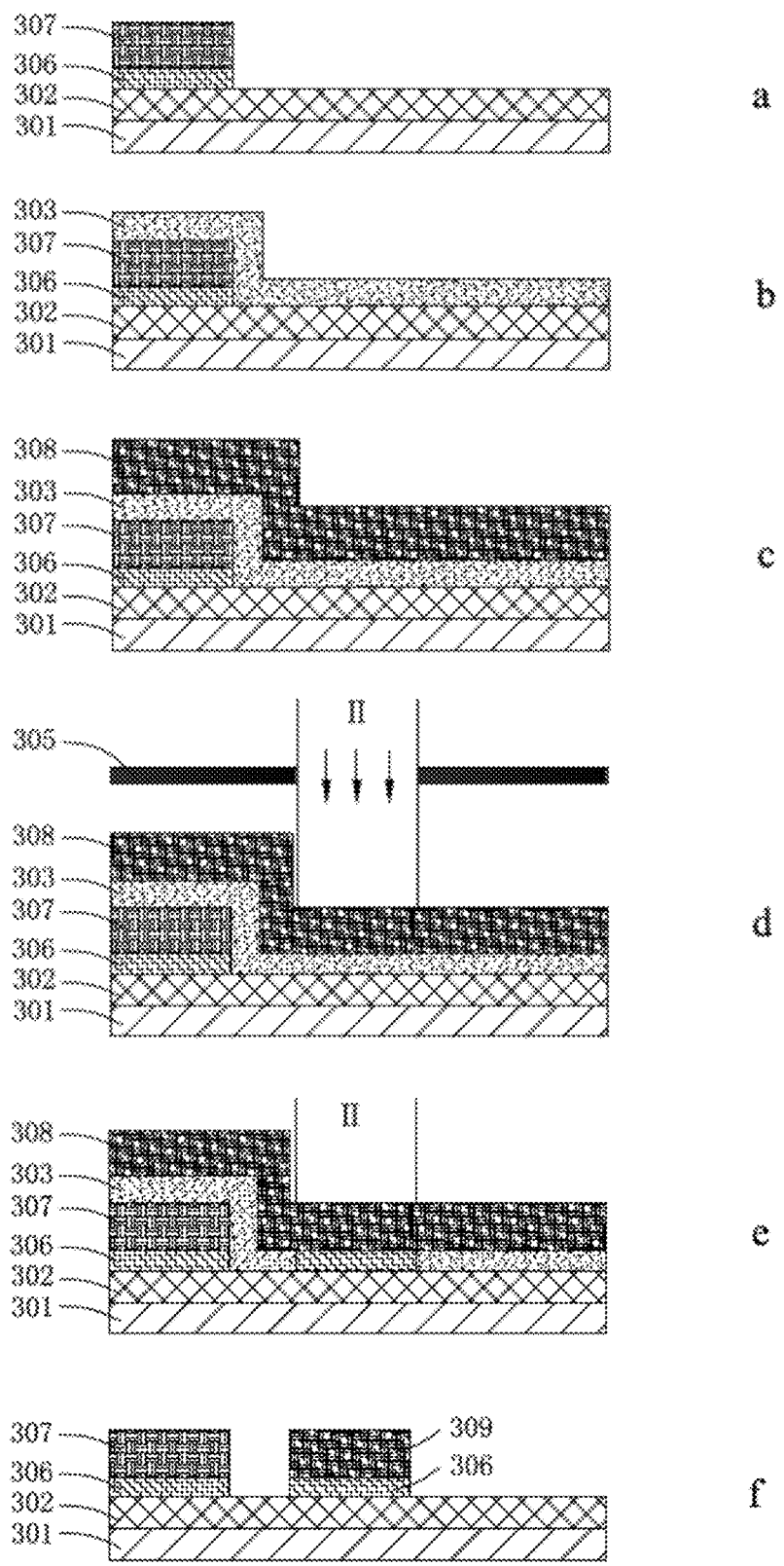
FIG. 4 is a diagram showing changes of film layers during a manufacturing process of a green quantum-dot light emitting layer of a display substrate provided in an embodiment of the present disclosure.

Further, as shown in FIG. 4, after the red quantum-dot light emitting layer 307 has been formed (as indicated by a in FIG. 4), a polypeptide polymer material layer 303 covering the red quantum-dot light emitting layer 307 and the electron transport layer 302 is formed (as indicated by b in FIG. 4). The polypeptide polymer material layer 303 can be formed by adding dropwise 100 to 150 µL of an aqueous solution of a water-soluble polypeptide polymer onto the red quantum-dot light emitting layer 307 and the electron transport layer 303, and spin-coating it by the spin-coater at a speed of rotation of 500 to 4,000 rpm, and then heating it on a hot stage at 50 to 80 degrees Celsius.

Then, a green quantum-dot material layer 308 covering the polypeptide polymer material layer 303 is formed (as indicated by c in FIG. 4). The green quantum-dot material layer 308 can be formed by spin-coating a low boiling point solution of green quantum dots in, for example, chloroform, toluene, n-hexane, n-octane, or n-heptane, onto the polypeptide polymer material layer 303, and drying it to form a film at a temperature of 80 to 120 degrees Celsius.

A portion of the polypeptide polymer material layer 303 that is located in a second region II is exposed by using a mask 305 (as indicated by d in FIG. 4) such that physicochemical properties of the exposed portion of the polypeptide polymer material layer 303 in the second region II are changed (as indicated by e in FIG. 4).

Thereafter, an unexposed portion (i.e., a portion where the physicochemical properties have not been changed) of the polypeptide polymer material layer 303 is dissolved by using a developing solution to obtain a structure indicated by f in FIG. 4. The portion of the polypeptide polymer material layer 303, where the physicochemical properties have been changed, forms an adsorption force with the electron transport layer, and thus will not be washed away by the developing solution, so as to obtain the hydrophilicity and hydrophobicity variable layer 306. Also, a portion of the green quantum-dot light emitting layer 309 formed on the hydrophilicity and hydrophobicity variable layer 306 can be guaranteed not to be washed away, and thus a green quantum-dot light emitting layer 309 is obtained.

Figure 5:
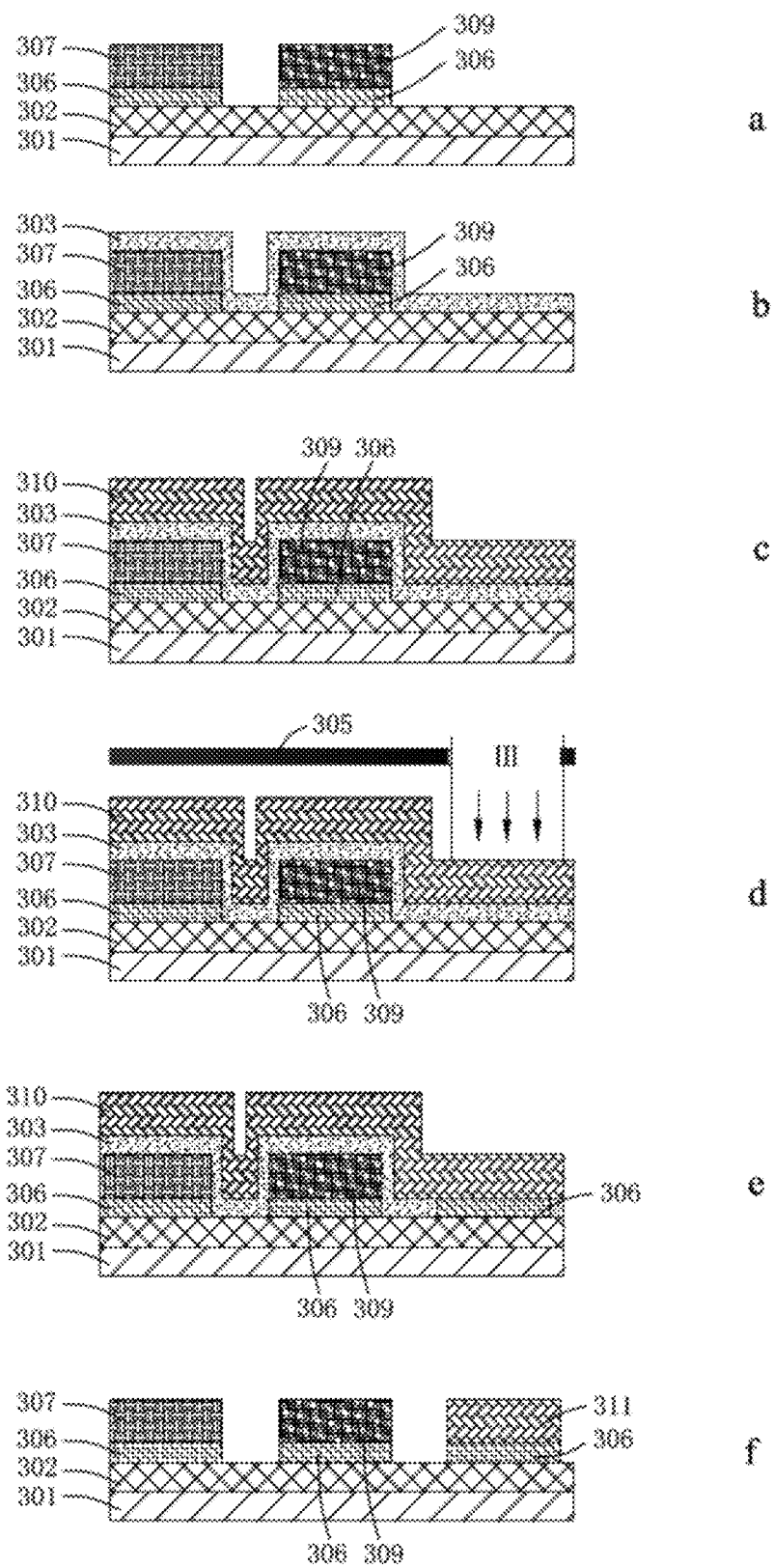
FIG. 5 is a diagram showing changes of film layers during a manufacturing process of a blue quantum-dot light emitting layer of a display substrate provided in an embodiment of the present disclosure.

Further, as shown in FIG. 5, after the red and green quantum-dot light emitting layers 307 and 309 are formed (as indicated by a in FIG. 5), a polypeptide polymer material layer 303 covering the red and green quantum-dot light emitting layers 307 and 309 and the electron transport layer 302 is formed (as indicated by b in FIG. 5). The polypeptide polymer material layer 303 can be formed by adding dropwise 100 to 150 µL of an aqueous solution of a water-soluble polypeptide polymer onto the red and green quantum-dot light emitting layers 307 and 309 and the electron transport layer 303, and spin-coating it by the spin-coater at a speed of rotation of 500 to 4,000 rpm, and then heating it on a hot stage at 50 to 80 degrees Celsius.

Then, a blue quantum-dot material layer 310 covering the polypeptide polymer material layer 303 is formed (as indicated by c in FIG. 5). The blue quantum-dot material layer 310 can be formed by spin-coating a low boiling point solution of blue quantum dots in, for example, chloroform, toluene, n-hexane, n-octane, or n-heptane, onto the polypeptide polymer material layer 303, and drying it to form a film at a temperature of 80 to 120 degrees Celsius.

A portion of the polypeptide polymer material layer 303 that is located in a third region III is exposed by using a mask 305 (as indicated by d in FIG. 5) such that physicochemical properties of the exposed portion of the polypeptide polymer material layer 303 in the third region III are changed (as indicated by e in FIG. 5).

Thereafter, an unexposed portion (i.e., a portion where the physicochemical properties have not been changed) of the polypeptide polymer material layer 303 is dissolved by using a developing solution to obtain a structure as indicated by f in FIG. 5. The portion of the polypeptide polymer material layer 303, where the physicochemical properties have been changed, forms an adsorption force with the electron transport layer, and thus will not be washed away by the developing solution, so as to obtain the hydrophilicity and hydrophobicity variable layer 306. Also, a portion of the blue quantum-dot light emitting layer 311 that is formed on the hydrophilicity and hydrophobicity variable layer 306 can be guaranteed not to be washed away, and thus a blue quantum-dot light emitting layer 311 is obtained.

Since the red quantum-dot light emitting layer 307, the green quantum-dot light emitting layer 309, and the blue quantum-dot light emitting layer 311 are formed in different positions, the first region I, the second region II, and the third region III are used to distinguish them from each other in the above description. The target region when forming the red quantum-dot light emitting layer 307 is the first region I, the target region when forming the green quantum-dot light emitting layer 309 is the second region II, and the target region when forming the blue quantum-dot light emitting layer 311 is the third region III.

Through the above-described method, the quantum-dot light emitting layers of different colors and the hydrophilicity and hydrophobicity variable layers each corresponding to the quantum-dot light emitting layer of each color can be formed on the electron transport layer.

Further, the exposing the portion of the hydrophilicity and hydrophobicity variable layer in the target region with the mask includes covering the quantum-dot light emitting layer with the mask which includes a light transmitting region corresponding to the target region; and exposing the portion of the hydrophilicity and hydrophobicity variable layer in the target region through ultraviolet light passing through the quantum-dot light emitting layer.

In the embodiment of the present disclosure, the light transmitting region is designed for the mask, and a size of each light transmitting region corresponds to a size of the quantum-dot light emitting layer to be manufactured.

Taking the above-mentioned formation of the red quantum-dot light emitting layer, the green quantum-dot light emitting layer, and the blue quantum-dot light emitting layer as an example, a same mask can be used, and a position corresponding to the light transmitting region of the mask can be adjusted each time the quantum-dot light emitting layer of each color is formed. Alternatively, three masks can be used and placed on a same position above the electron transparent layer, but the positions corresponding to the light transmitting regions of the different masks are different.

In this embodiment, the light used to irradiate the polypeptide polymer material layer is ultraviolet light.

The polypeptide polymer material layer can include water-soluble polypeptide polymers or water-soluble proteins.

An embodiment of the present disclosure further provides a display device including the display substrate as described above.

The display device can be a display, a mobile phone, a tablet computer, a television, a wearable electronic device, a navigation display device, etc.

Technical or scientific terms used in the present disclosure shall have ordinary meanings understood by those having ordinary skills in the art to which the present disclosure pertains, unless otherwise defined. The terms "first", "second", and the like used herein are not intended to indicate any order, quantity, or importance, but are only used to distinguish different components from each other. The term "including", "comprising", or any similar variety is intended to specify that the element or item stated before these terms encompasses the elements or items and equivalents thereof listed after these terms, but do not preclude the other elements or items. The phrases "connected", "connecting", etc. are not limited to a physical or mechanical connection, but may also include an electrical connection, either direct or indirect. The terms "up", "down", "left", "right", etc., are merely used to indicate a relative positional relationship, and if the absolute position of the described object is changed, the relative positional relationship will be changed accordingly.

It will be understood that when an element such as a layer, a film, a region, or a substrate is mentioned to be "on" or "under" another element, it can be "directly" "on" or "under" the other element, or there can be one or more intermediate elements.

While the embodiments of the present disclosure have been described above in conjunction with the drawings, it is not limited to these specific embodiments, and the specific embodiments are merely illustrative and not restrictive. Those skilled in the art can also make many forms without departing from the spirit of the present disclosure and the scope of the claims under the inspiration of the present disclosure, and all of the forms fall within the protection scope of the present disclosure.

What is claimed is:

1. A display substrate, comprising:
   a plurality of light emitting units of different colors, each of which comprises:
   an electron transport layer,
   a hole transport layer,
   a quantum-dot light emitting layer located between the electron transport layer and the hole transport layer; and
   a hydrophilicity and hydrophobicity variable layer, located between the electron transport layer and the quantum-dot light emitting layer, the hydrophilicity and hydrophobicity variable layer having a first hydrophobic side in contact with the electron transport layer and a second hydrophobic side in contact with the quantum-dot light emitting layer.

2. The display substrate according to claim 1, wherein the exposure treatment of the hydrophilicity and hydrophobicity variable layer is performed by irradiation with ultraviolet rays;
   prior to the exposure treatment by the irradiation with the ultraviolet rays, an exterior of the hydrophilicity and hydrophobicity variable layer is hydrophilic, and an interior of the hydrophilicity and hydrophobicity variable layer is hydrophobic; and
   subsequent to the exposure treatment by the irradiation with the ultraviolet rays, the exterior of the hydrophilicity and hydrophobicity variable layer becomes hydrophobic, and the interior of the hydrophilicity and hydrophobicity variable layer becomes hydrophilic.

3. The display substrate according to claim 2, wherein the hydrophilicity and hydrophobicity variable layer comprises water-soluble polypeptide polymers.

4. The display substrate according to claim 2, wherein the hydrophilicity and hydrophobicity variable layer comprises water-soluble proteins.

5. The display substrate according to claim 4, wherein amino acids of the lower proteins which are in contact with the electron transport layer comprise amine functional groups which form hydrogen bonding adsorption effects with hydroxyl groups on a surface of the electron transport layer.

6. The display substrate according to claim 4, wherein amino acids of the upper proteins which are in contact with the quantum-dot light emitting layer comprise amine functional groups, which coordinate with metal atoms on a nanocrystal surface of the quantum-dot light emitting layer to form adsorption effects.

7. The display substrate according to claim 4, wherein the metal atom on a nanocrystal surface of the quantum-dot light emitting layer comprises one or more of Cd, Pb, Se and Zn.

8. The display substrate according to claim 1, wherein the light emitting units comprise one or more red light emitting units, one or more green light emitting units, and one or more blue light emitting units.

9. The display substrate according to claim 1, wherein the electron transport layer comprises a zinc oxide material.

10. The display substrate according to claim 1, wherein the electron transport layer comprises a mixed material of zinc oxide and a metal.

11. The display substrate according to claim 1, wherein an interval between the quantum-dot light emitting layer comprised in each of the plurality of light emitting units of different colors and the quantum-dot light emitting layer comprised in an adjacent one of the light-emitting units is consistent.

12. A display device, comprising a display substrate according to claim 1.

13. A method for manufacturing a display substrate, comprising:
    forming an electron transport layer;
    forming hydrophilicity and hydrophobicity variable layers and a plurality of quantum-dot light emitting layers of different colors on the electron transport layer, wherein each of the hydrophilicity and hydrophobicity variable layer is located between each of the quantum-dot light emitting layers and the electron transporter layer, the hydrophilicity and hydrophobicity variable layer having a first hydrophobic side in contact with the electron transport layer and a second hydrophobic side in contact with the quantum-dot light emitting layer;
    forming a hole transport layer on the plurality of quantum-dot light emitting layers of different colors; and
    performing an exposure treatment on each of the hydrophilicity and hydrophobicity variable layer to change hydrophilicity and hydrophobicity of sides of the hydrophilicity and hydrophobicity variable layer that are in contact with the electron transport layer and the quantum-dot light emitting layer.

14. The method according to claim 13, wherein the forming the hydrophilicity and hydrophobicity variable layers and the plurality of quantum-dot light emitting layers of different colors on the electron transport layer comprises:
    forming the quantum-dot light emitting layer of each color and its corresponding hydrophilicity and hydrophobicity variable layer on the electron transport layer, wherein the quantum-dot light emitting layers of the different colors are formed separately.

15. The method according to claim 14, wherein the forming the quantum-dot light emitting layer of each color and its corresponding hydrophilicity and hydrophobicity variable layer on the electron transport layer, forming the quantum-dot light emitting layer of one color and its corresponding hydrophilicity and hydrophobicity variable layer comprises:
   forming the hydrophilicity and hydrophobicity variable layer and the quantum-dot light emitting layer of the color covering the hydrophilicity and hydrophobicity variable layer on the electron transport layer;
   exposing a portion of the hydrophilicity and hydrophobicity variable layer located in a target region with a mask to change hydrophilicity and hydrophobicity of sides of the exposed portion of the hydrophilicity and hydrophobicity variable layer in the target region, which are in contact with the electron transport layer and the quantum-dot light emitting layer; and
   dissolving a portion of the hydrophilicity and hydrophobicity variable layer, which is not exposed, by using a developing solution to form the hydrophilicity and hydrophobicity variable layer in the target region and the quantum-dot light emitting layer of the color.

16. The method according to claim 15, wherein the exposing the portion of the hydrophilicity and hydrophobicity variable layer in the target region with the mask comprises:
   covering the quantum-dot light emitting layer with the mask which comprises a light transmitting region corresponding to the target region; and
   exposing the portion of the hydrophilicity and hydrophobicity variable layer in the target region through ultraviolet light passing through the quantum-dot light emitting layer.

17. The method according to claim 15, wherein the developing solution comprises deionized or distilled water.

18. The method according to claim 15, wherein the hydrophilicity and hydrophobicity variable layer comprises water-soluble polypeptide polymers or water-soluble proteins.

19. A method for manufacturing a display substrate, comprising:
   forming an electron transport layer;
   forming hydrophilicity and hydrophobicity variable layers and a plurality of quantum-dot light emitting layers of different colors on the electron transport layer, wherein each of the hydrophilicity and hydrophobicity variable layer is located between each of the quantum-dot light emitting layers and the electron transport layer;
   forming a hole transport layer on the plurality of quantum-dot light emitting layers of different colors; and
   performing an exposure treatment on each of the hydrophilicity and hydrophobicity variable layer to change hydrophilicity and hydrophobicity of sides of the hydrophilicity and hydrophobicity variable layer that are in contact with the electron transport layer and the quantum-dot light emitting layer,
   wherein the forming the hydrophilicity and hydrophobicity variable layers and the plurality of quantum-dot light emitting layers of different colors on the electron transport layer comprises:
   forming the quantum-dot light emitting layer of each color and its corresponding hydrophilicity and hydrophobicity variable layer on the electron transport layer, wherein the quantum-dot light emitting layers of the different colors are formed separately,
   wherein the forming the quantum-dot light emitting layer of each color and its corresponding hydrophilicity and hydrophobicity variable layer on the electron transport layer, forming the quantum-dot light emitting layer of one color and its corresponding hydrophilicity and hydrophobicity variable layer comprises:
   forming the hydrophilicity and hydrophobicity variable layer and the quantum-dot light emitting layer of the color covering the hydrophilicity and hydrophobicity variable layer on the electron transport layer;
   exposing a portion of the hydrophilicity and hydrophobicity variable layer located in a target region with a mask to change hydrophilicity and hydrophobicity of sides of the exposed portion of the hydrophilicity and hydrophobicity variable layer in the target region, which are in contact with the electron transport layer and the quantum-dot light emitting layer; and
   dissolving a portion of the hydrophilicity and hydrophobicity variable layer, which is not exposed, by using a developing solution to form the hydrophilicity and hydrophobicity variable layer in the target region and the quantum-dot light emitting layer of the color.

* * * * *